United States Patent
Masunaga et al.

(10) Patent No.: US 8,897,391 B2
(45) Date of Patent: Nov. 25, 2014

(54) DISTORTION COMPENSATOR AND DISTORTION COMPENSATION METHOD

(75) Inventors: Daisuke Masunaga, Yokohama (JP);
Satoshi Matsubara, Kawasaki (JP);
Takeshi Ohba, Yokosuka (JP);
Hideharu Shako, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/612,728

(22) Filed: Sep. 12, 2012

(65) Prior Publication Data
US 2013/0083866 A1  Apr. 4, 2013

(30) Foreign Application Priority Data

Sep. 30, 2011 (JP) ................................. 2011-217256

(51) Int. Cl.
*H04K 1/02* (2006.01)
*H04B 1/04* (2006.01)

(52) U.S. Cl.
CPC ...... *H04B 1/0475* (2013.01); *H04B 2001/0425* (2013.01)
USPC ............ 375/297; 375/296; 375/324; 375/254

(58) Field of Classification Search
USPC .................. 375/297, 296, 324, 254
See application file for complete search history.

(56) References Cited

U.S. PATENT DOCUMENTS

| 6,587,514 | B1 * | 7/2003 | Wright et al. | 375/296 |
| 7,466,763 | B2 | 12/2008 | Funyu et al. | |
| 2004/0001559 | A1 * | 1/2004 | Pinckley et al. | 375/297 |
| 2005/0047521 | A1 | 3/2005 | Ishikawa et al. | |
| 2005/0195919 | A1 * | 9/2005 | Cova | 375/297 |
| 2011/0227643 | A1 | 9/2011 | Matsubara et al. | |

FOREIGN PATENT DOCUMENTS

| JP | 2003-347944 | 12/2003 |
| JP | 2007-049251 | 2/2007 |
| JP | 2007-208684 | 8/2007 |
| JP | 2010-061657 | 3/2010 |
| JP | 2011-199429 | 10/2011 |
| WO | WO-03/103163 | 12/2003 |

* cited by examiner

*Primary Examiner* — Kabir A Timory
(74) *Attorney, Agent, or Firm* — Fujitsu Patent Center

(57) ABSTRACT

A distortion compensator compensates for distortion of a signal caused by an amplifier. A storage section stores a plurality of compensation coefficients used for distortion compensation. A selection section selects a compensation coefficient corresponding to an index value indicative of a power level of the signal from among the plurality of compensation coefficients. The selection section determines whether or not the power level is higher than a threshold, and uses, based on a determination result, a first index value calculated without using a logarithmic operation or a second index value calculated by using a logarithmic operation.

7 Claims, 19 Drawing Sheets

FIG. 6

| ADDRESS | |
|---|---|
| 0 | COMPENSATION COEFFICIENT #0 |
| 1 | COMPENSATION COEFFICIENT #1 |
| ⋮ | ⋮ |
| 49 | COMPENSATION COEFFICIENT #49 |
| 50 | COMPENSATION COEFFICIENT #50 |
| 51 | COMPENSATION COEFFICIENT #51 |
| ⋮ | ⋮ |
| 99 | COMPENSATION COEFFICIENT #99 |
| 100 | COMPENSATION COEFFICIENT #100 |

DISTORTION COMPENSATOR AND DISTORTION COMPENSATION METHOD

CROSS-REFERENCE TO RELATED APPLICATION

This application is based upon and claims the benefit of priority of the prior Japanese Patent Application No. 2011-217256, filed on Sep. 30, 2011, the entire contents of which are incorporated herein by reference.

FIELD

The embodiments discussed herein are related to a distortion compensator and a distortion compensation method.

BACKGROUND

In a radio communication system in which a plurality of radio communication apparatus transmit signals to one another, amplifiers (also referred to as power amplifiers) for amplifying transmitted signals before emitting them from antennas are used. An amplifier may have a nonlinear amplification characteristic. That is to say, the relationship between the power level of a signal inputted to an amplifier and the power level of a signal outputted from the amplifier may not be linear. The nonlinearity of an amplifier causes distortion of a transmitted signal. This may lead to inter-channel interference caused by power leakage into adjacent frequencies or a deterioration in radio communication quality.

Therefore, in order to control distortion of a transmitted signal which has passed through an amplifier, a radio communication apparatus may include a pre-distortion type distortion compensator. Before a transmitted signal is inputted to an amplifier, a pre-distortion type distortion compensator (also referred to as a predistorter) adds distortion having a characteristic reverse to the amplification characteristic to the transmitted signal. This controls distortion of the transmitted signal which has passed through the amplifier and compensates for the nonlinearity of the amplifier.

For example, a distortion compensator compensates for distortion of a transmitted signal by the use of a compensation coefficient corresponding to a power level of the transmitted signal. Some distortion compensators store a plurality of compensation coefficients used for distortion compensation in LUTs (LookUp Tables), designate addresses corresponding to the power levels of transmitted signals, and read out compensation coefficients from the LUTs. Furthermore, some distortion compensators compare original transmitted signals before distortion compensation with feedback signals generated from transmitted signals which have passed through amplifiers, and update compensation coefficients so as to make the differences between them small.

In addition, the following distortion compensator is proposed. The frequency with which each address in an LUT is designated is monitored. An address proportional to a power level is converted to an actual address in the LUT so as to equalize the frequency of designation. As a result, there is no great difference in frequency of update among a plurality of compensation coefficients.

International Publication Pamphlet No. WO03/103163
Japanese Laid-open Patent Publication No. 2007-49251

By the way, with a distortion compensator the following method is possible. A compensation coefficient is stored in a storage area, such as an LUT, so that it will be proportional to, for example, an index value (such as a power value, an amplitude, or a logarithm of the power value) indicative of a power level. A compensation coefficient is selected based on the index value. With the method for selecting a compensation coefficient by the use of one index value, however, compensation accuracy changes according to a power level. Accordingly, it is difficult to efficiently improve compensation accuracy in a wide range of power levels.

For example, if a plurality of compensation coefficients are prepared so that they will be proportional to a power value and an amplitude, then the number of compensation coefficients assigned to a range of power levels lower than an average may be smaller than that of compensation coefficients assigned to a range of power levels higher than the average. As a result, compensation accuracy may deteriorate on the low power level side. Furthermore, if a plurality of compensation coefficients are prepared so that they will be proportional to a logarithm of a power value, then the number of compensation coefficients assigned to a range of power levels higher than an average may be smaller than that of compensation coefficients assigned to a range of power levels lower than the average. As a result, compensation accuracy may deteriorate on the high power level side.

SUMMARY

According to an aspect, there is provided a distortion compensator for compensating for distortion of a signal caused by an amplifier. The distortion compensator includes a storage section and a selection section. The storage section stores a plurality of compensation coefficients used for distortion compensation. The selection section selects a compensation coefficient corresponding to an index value indicative of a power level of the signal from among the plurality of compensation coefficients stored in the storage section. The selection section determines whether or not the power level is higher than a threshold. Based on a determination result, the selection section uses as the index value a first index value calculated without using a logarithmic operation or a second index value calculated by using a logarithmic operation.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is an example of a lookup table;

DESCRIPTION OF EMBODIMENTS

Figure 1:
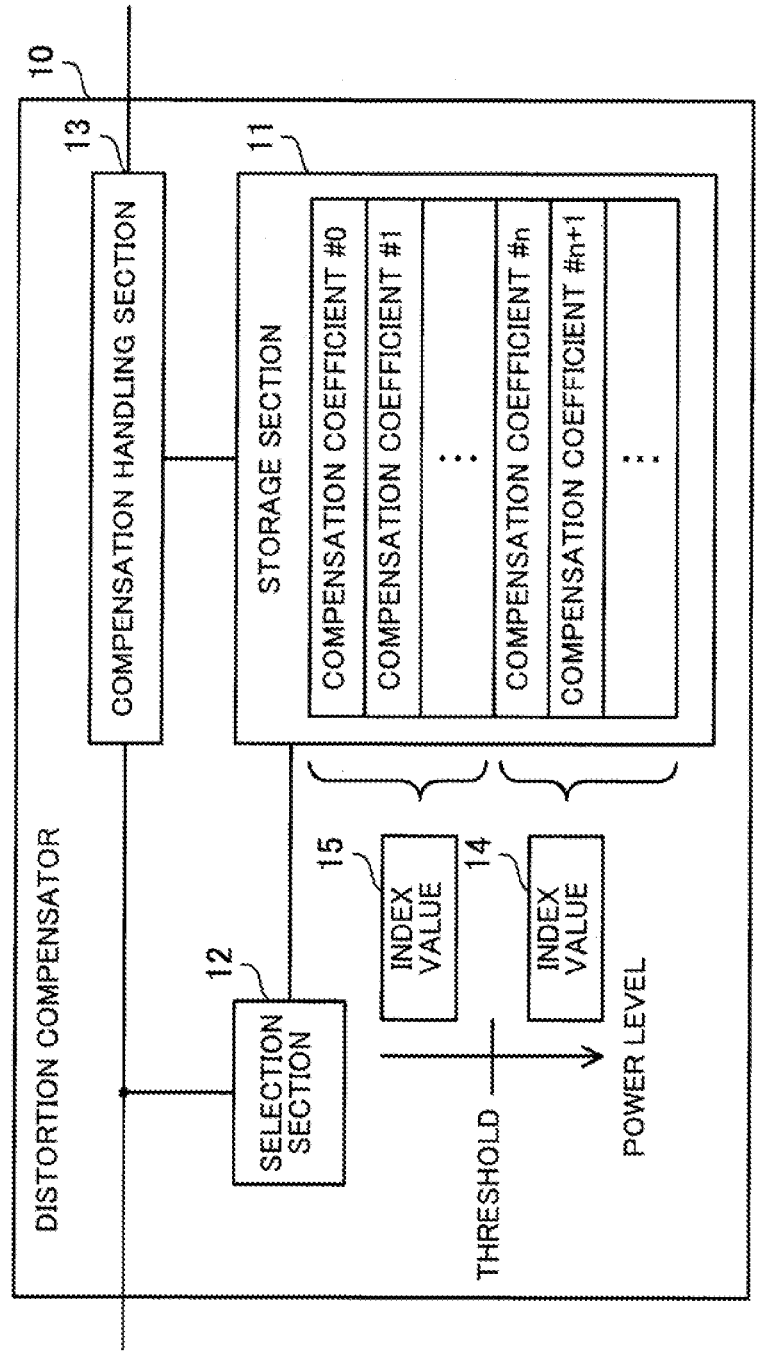
FIG. 1 illustrates a distortion compensator according to a first embodiment.

Embodiments will now be described with reference to the accompanying drawings, wherein like reference numerals refer to like elements throughout.

(First Embodiment)

FIG. 1 illustrates a distortion compensator according to a first embodiment. A distortion compensator 10 compensates for distortion of a signal caused because of the use of an amplifier having a nonlinear amplification characteristic. For example, the distortion compensator 10 is a pre-distortion type distortion compensator. That is to say, before a signal is inputted to the amplifier, the distortion compensator 10 adds distortion having a characteristic reverse to the amplification characteristic to the signal. The distortion compensator 10 may be included in a radio communication apparatus such as a base station.

The distortion compensator 10 includes a storage section 11, a selection section 12, and a compensation handling section 13.

The storage section 11 stores a plurality of compensation coefficients used for distortion compensation. For example, a compensation coefficient is a complex number including a real part corresponding to an in-phase component (I component) of a signal and an imaginary part corresponding to a quadrature component (Q component) of the signal. The storage section 11 may be a volatile or nonvolatile memory and a storage area in the storage section 11 may be used as a lookup table (LUT). For example, the storage section 11 stores compensation coefficients by associating them with addresses, and outputs to the compensation handling section 13 a compensation coefficient corresponding to an address designated by the selection section 12.

The selection section 12 calculates an index value indicative of a power level of a signal and selects a compensation coefficient corresponding to the index value from among the plurality of compensation coefficients stored in the storage section 11. For example, the selection section 12 generates an address proportional to the index value, and designates the address for the storage section 11. In this case, the selection section 12 determines whether or not the power level of the signal is higher than a threshold, and uses an index value 14 (first index value) or an index value 15 (second index value) based on a determination result.

The index value 14 is calculated without using a logarithmic operation, and is, for example, a power value or an amplitude of a signal. The index value 15 is calculated by using a logarithmic operation, and is, for example, a logarithm of a power value. For example, when the power level is higher than the threshold, the selection section 12 uses the index value 14. When the power level is lower than or equal to the threshold, the selection section 12 uses the index value 15. Furthermore, the selection section 12 generates, for example, an address proportional to the selected index value 14 or 15 and designates the address for the storage section 11. In this case, possible values for the index value 14 used at the time of the power level being higher than the threshold are associated with a first address range of the storage section 11 and possible values for the index value 15 used at the time of the power level being lower than or equal to the threshold are associated with a second address range of the storage section 11.

As a result, for example, compensation coefficients are prepared on the high power level side so that they will be proportional to the possible values for the index value 14. Compensation coefficients are prepared on the low power level side so that they will be proportional to the possible values for the index value 15. Whether a power level is high or low may be determined by comparing one of a plurality of index values including the index values 14 and 15 with a threshold or by comparing an address generated from one of a plurality of index values with a threshold.

The compensation handling section 13 makes distortion compensation by applying a compensation coefficient read out from the storage section 11 to a signal (multiplying a digital signal including an I component and a Q component by a compensation coefficient, for example). For example, the signal to which the compensation coefficient is applied is converted to an analog signal and is inputted to the amplifier. The distortion compensator 10 may compare the original signal before the distortion compensation with a feedback signal generated from a signal which passes through the amplifier, and update a compensation coefficient stored in the storage section 11 so as to make the difference between them small. In this case, a compensation coefficient selected by the selection section 12 is updated.

With the distortion compensator 10 according to the first embodiment whether or not a power level of a signal is greater than a threshold is determined. Based on a determination result, the index value 14 calculated without using a logarithmic operation or the index value 15 calculated by using a logarithmic operation is selected as an index value indicative of the power level. A compensation coefficient corresponding to the selected index value 14 or 15 is then selected from among a plurality of compensation coefficients which are stored in the storage section 11 and which are used for distortion compensation.

If only one index value is used, compensation accuracy may change according to a power level. For example, if only an address proportional to the index value 14 is generated as an address for accessing a compensation coefficient, then the number of compensation coefficients may be small on the low power level side. If only an address proportional to the index value 15 is generated as an address for accessing a compensation coefficient, then the number of compensation coefficients may be small on the high power level side. On the other hand, which of the index values 14 and 15 is used depends on whether a power level is high or low. As a result, the imbalance in the number of compensation coefficients can be controlled and compensation accuracy can efficiently be improved in a wide range of power levels.

In a second embodiment described later, a base station including a distortion compensator is taken as an example. However, the distortion compensator 10 according to the first embodiment or a distortion compensator described in a second embodiment can be included in various radio communication apparatus such as mobile stations.

(Second Embodiment)

Figure 2:
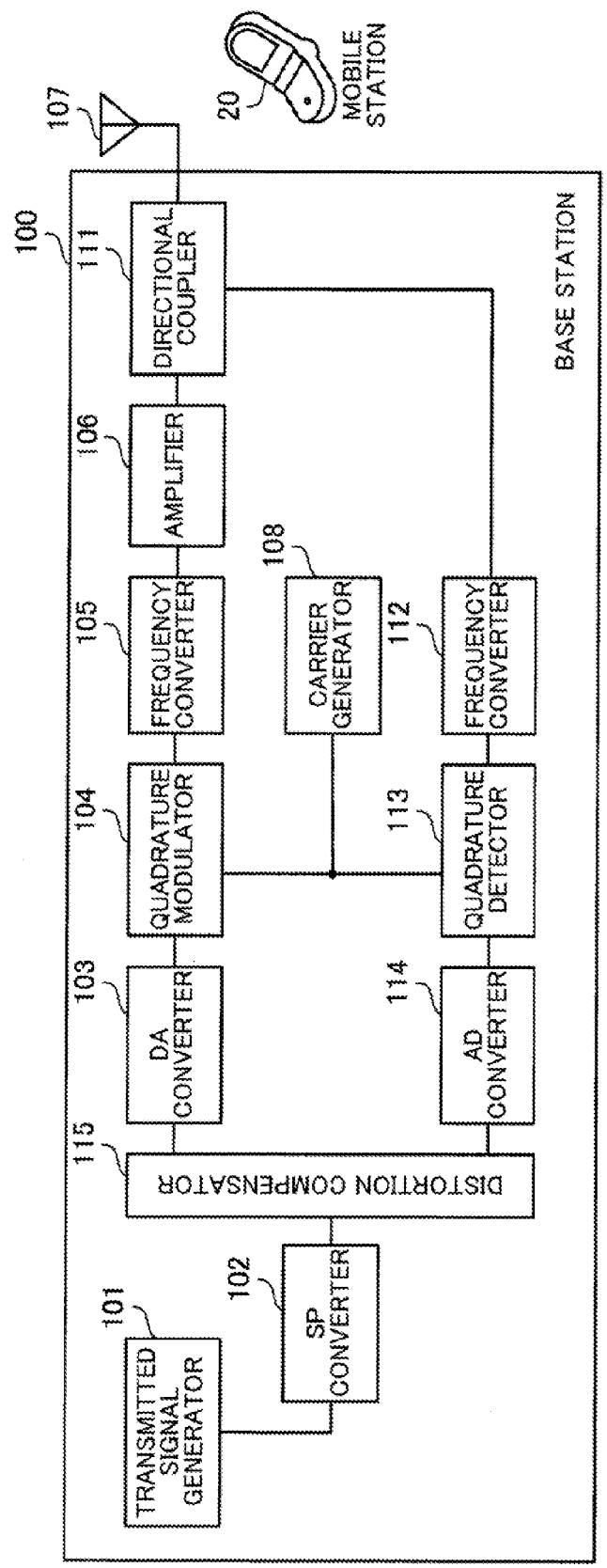
FIG. 2 illustrates a radio communication system according to a second embodiment.

FIG. 2 illustrates a radio communication system according to a second embodiment. A radio communication system according to a second embodiment includes a base station 100 and a mobile station 20. The base station 100 performs radio communication with a plurality of mobile stations including the mobile station 20. In FIG. 2, an example of a circuit used for transmitting a radio signal from the base station 100 to the mobile station 20 is indicated.

The base station 100 includes a transmitted signal generator 101, an SP (Serial/Parallel) converter 102, a DA (Digital Analog) converter 103, a quadrature modulator 104, frequency converters 105 and 112, an amplifier 106, an antenna 107, a carrier generator 108, a directional coupler 111, a quadrature detector 113, an AD (Analog Digital) converter 114, and a distortion compensator 115.

The transmitted signal generator 101 generates a serial digital signal string as a transmitted signal. The transmitted signal may include a user data signal a destination of which is the mobile station 20 and a radio control signal.

The SP converter 102 converts the serial digital signal string generated by the transmitted signal generator 101 to a digital signal string including I components and a digital signal string including Q components. For example, the SP converter 102 assigns each bit in the digital signal string alternately to an I component and a Q component.

The DA converter 103 acquires via the distortion compensator 115 the digital signal string which includes I components and Q components and which is generated by the SP converter 102. The DA converter 103 converts a digital signal to an analog baseband signal according to I components and Q components.

The quadrature modulator 104 multiplies an analog baseband signal corresponding to an I component generated by the DA converter 103 by a reference carrier signal (cosine signal) generated by the carrier generator 108. In addition, the quadrature modulator 104 multiplies an analog baseband signal corresponding to a Q component generated by the DA converter 103 by a signal (sine signal) obtained by shifting by 90 degrees the phase of the reference carrier signal generated by the carrier generator 108. The quadrature modulator 104 then adds together multiplication results corresponding to the I component and the Q component. By doing so, the quadrature modulator 104 generates a quadrature-modulated analog baseband signal.

The frequency converter 105 mixes the analog baseband signal generated by the quadrature modulator 104 with an oscillating signal from a local oscillator (not illustrated). By doing so, the frequency converter 105 converts (up-converts) the analog baseband signal to a radio frequency signal at a high frequency.

The amplifier 106 amplifies the power of the radio frequency signal generated by the frequency converter 105. However, the amplifier 106 has a nonlinear amplification characteristic. That is to say, the relationship between the power level of a radio frequency signal inputted to the amplifier 106 and the power level of a radio frequency signal outputted from the amplifier 106 is not linear.

The antenna 107 acquires the radio frequency signal amplified by the amplifier 106 via the directional coupler 111, and emits the radio frequency signal into the air. The antenna 107 may be only for transmission or be both for transmission and for receiving.

The carrier generator 108 generates a reference carrier signal at a determined frequency and supplies the reference carrier signal to the quadrature modulator 104 and the quadrature detector 113.

The directional coupler 111 outputs a part of the power of the radio frequency signal amplified by the amplifier 106 to the frequency converter 112. The ratio of power outputted to the antenna 107 to power outputted to the frequency converter 112 is set in advance and it is desirable that the latter is significantly lower than the former.

The frequency converter 112 mixes the radio frequency signal taken by the directional coupler 111 with an oscillating signal from the local oscillator (not illustrated). By doing so, the frequency converter 112 converts (down-converts) the radio frequency signal to a low-frequency analog baseband signal.

The quadrature detector 113 multiplies the analog baseband signal generated by the frequency converter 112 by the reference carrier signal (cosine signal) generated by the carrier generator 108 in order to extract the analog baseband signal corresponding to the I component. Furthermore, the quadrature detector 113 multiplies the analog baseband signal generated by the frequency converter 112 by a signal (sine signal) obtained by shifting by 90 degrees the phase of the reference carrier signal generated by the carrier generator 108 in order to extract an analog baseband signal corresponding to the Q component.

The AD converter 114 converts the analog baseband signals corresponding to the I and Q components extracted by the quadrature detector 113 to digital signals, and generates a feedback signal.

The distortion compensator 115 compensates by the predistortion method for distortion of the transmitted signal caused because of the use of the amplifier 106 having a nonlinear amplification characteristic. The distortion compensator 115 is included as, for example, a DSP (Digital Signal Processor). The distortion compensator 115 acquires the transmitted signal including I components and Q components from the SP converter 102, and applies a compensation coefficient corresponding to a power level of the transmitted signal. By doing so, the distortion compensator 115 gives the transmitted signal distortion having a characteristic reverse to the amplification characteristic of the amplifier 106. In addition, the distortion compensator 115 acquires the feedback signal from the AD converter 114, and continuously updates a compensation coefficient so as to make the difference between the original transmitted signal before the distortion compensation and the feedback signal small.

Figure 3:
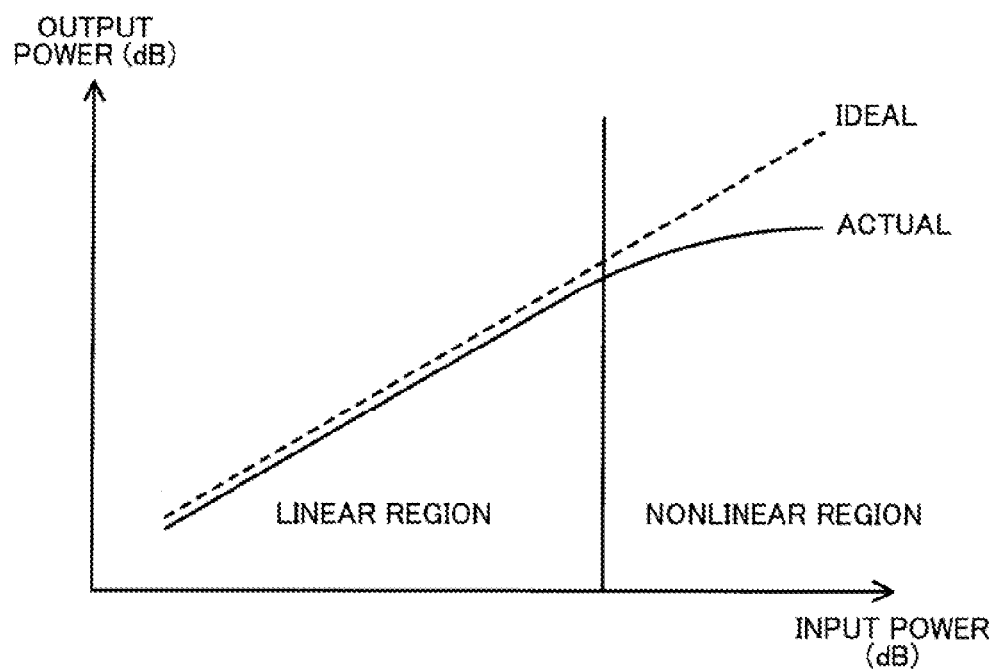
FIG. 3 is an example of the input-output characteristic of an amplifier.

FIG. 3 is an example of the input-output characteristic of an amplifier. Ideally, it is desirable that an amplifier has a linear amplification characteristic. That is to say, it is desirable that the power level of a signal inputted to an amplifier is proportional to the power level of a signal outputted from it. However, the amplification characteristic of the amplifier 106 tends to approach an ideal amplification characteristic in an interval in which the power level of an input signal is low (linear region). However, on the other hand, the amplification characteristic of the amplifier 106 tends to deviate from an ideal amplification characteristic in an interval in which the power level of an input signal is high (nonlinear region).

To increase the upper limit of a power level which the amplifier 106 can handle is possible as a method for expanding the linear region. In this case, however, the amplifier 106 has excessive amplification capability. From the viewpoint of the circuit scale of the amplifier 106 or costs, this method is disadvantageous. Furthermore, an amplification characteristic becomes more complex with improvement in the performance of an amplifier. As a result, an amplification characteristic may not be linear even in an interval in which the power level of an input signal is low. Accordingly, it is desirable that the distortion compensator 115 can compensate for distortion of a transmitted signal with accuracy in a wide range of power levels.

Figure 4:
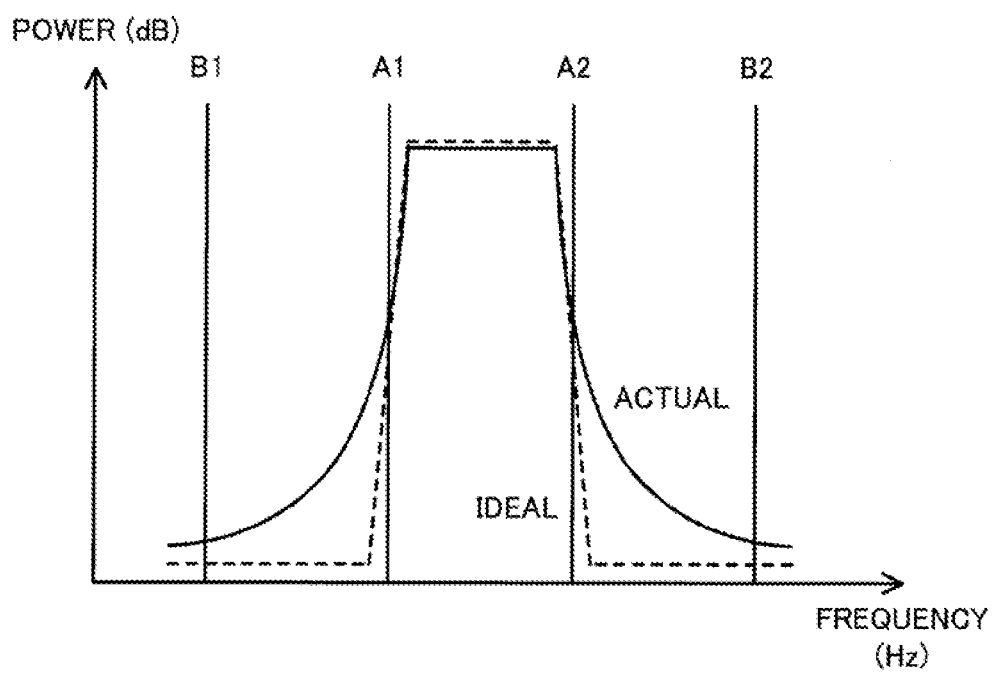
FIG. 4 is an example of power leakage caused by nonlinear distortion.

FIG. 4 is an example of power leakage caused by nonlinear distortion. In FIG. 4, a frequency band A1-A2 is a desired frequency band which the base station 100 uses for radio communication. Frequency bands A1-B1 and A2-B2 are frequency bands adjacent to the desired frequency band.

It is desirable to control power leakage into adjacent frequency bands and to make ACPR (Adjacent Channel Power Ratio) low. ACPR corresponds to the ratio of the total of power in the frequency bands A1-B1 and A2-B2 to the total of power in the frequency band A1-A2. Power leakage produces interference noise on radio channels in the adjacent frequency bands and contributes to deterioration in communication quality on these radio channels. Distortion of a transmitted signal caused by the amplifier 106 increases power leakage into the adjacent frequency bands, so it is desirable to compensate for the distortion with accuracy.

Figure 5:
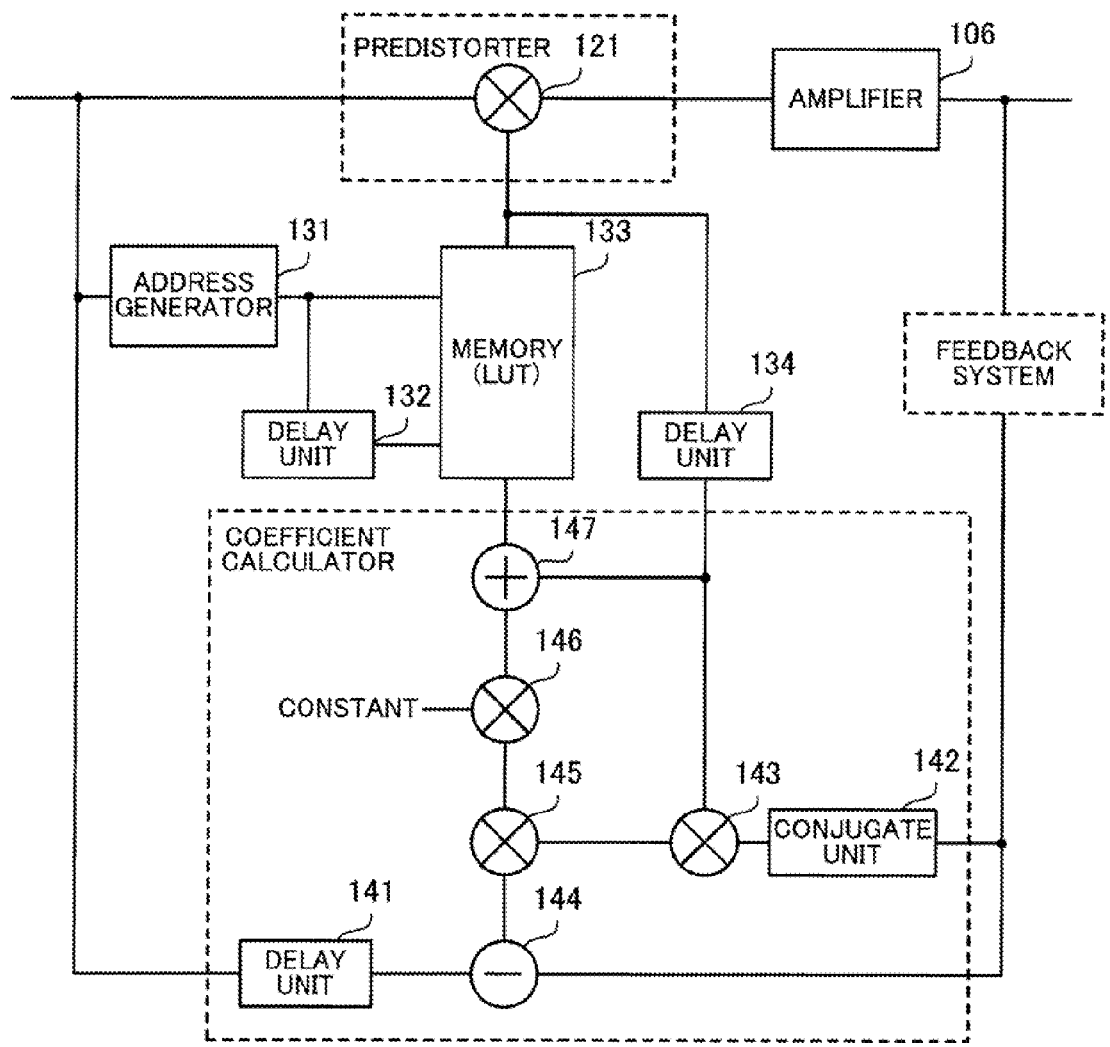
FIG. 5 is a block diagram of a distortion compensator in the second embodiment.

FIG. 5 is a block diagram of the distortion compensator in the second embodiment. The distortion compensator 115 includes an address generator 131, a memory 133, multipliers 121, 143, 145, and 146, an adder 147, a subtractor 144, delay units 132, 134, and 141, and a conjugate unit 142.

The multiplier 121 multiplies a transmitted signal which includes I components and Q components and which is acquired from the SP converter 102 by a compensation coefficient which is outputted from the memory 133 and which is represented as a complex number. The transmitted signal to which the compensation coefficient is applied is inputted to the amplifier 106 via the DA converter 103, the quadrature modulator 104, and the frequency converter 105. The multiplier 121 is included in a predistorter which applies the compensation coefficient to the transmitted signal, and is an example of the compensation handling section 13 in the first embodiment.

The address generator 131 generates an address corresponding to a power level of the transmitted signal acquired from the SP converter 102. The address generator 131 outputs the generated address to the memory 133 as a read address and outputs the generated address to the delay unit 132 as a write address. When the address generator 131 generates the address, the address generator 131 calculates a discrete value indicative of the power level as an index value, and converts the index value to the address. A power value, an amplitude, and a logarithm of the power value are used as an index value. The address generator 131 properly uses the plurality of index values according to power levels. The address generator 131 is an example of the selection section 12 in the first embodiment.

By holding the address generated by the address generator 131 for a certain period of time, the delay unit 132 delays timing at which the address is inputted to the memory 133. Time of the delay caused by the delay unit 132 corresponds to, for example, a period (feedback period) from the time when the compensation coefficient is applied to the transmitted signal to the time when a feedback signal generated from the transmitted signal which passes through the amplifier 106 and which is amplified by the amplifier 106 is inputted to the distortion compensator 115.

The memory 133 stores a lookup table (LUT) in which a plurality of compensation coefficients associated with addresses are stored. The memory 133 has an address port to which the read address is inputted from the address generator 131 and an address port to which the write address is inputted from the delay unit 132. In addition, the memory 133 has an output port from which a compensation coefficient is outputted to the multiplier 121 and an input port to which a compensation coefficient is inputted from the adder 147.

When the address is inputted from the address generator 131, the memory 133 outputs a compensation coefficient stored at a position in the LUT indicated by the address to the multiplier 121 and the delay unit 134. Furthermore, when the address is inputted from the delay unit 132, the memory 133 writes a compensation coefficient inputted from the adder 147 to a position in the LUT indicated by the address. The memory 133 is an example of the storage section 11 in the first embodiment.

By holding the compensation coefficient outputted from the memory 133 for a certain period of time, the delay unit 134 delays timing at which the compensation coefficient is inputted to the multiplier 143 and the adder 147. Time of the delay caused by the delay unit 134 corresponds to, for example, the above feedback period.

By holding the transmitted signal acquired from the SP converter 102 for a certain period of time, the delay unit 141 delays timing at which the transmitted signal is inputted to the subtractor 144. Time of the delay caused by the delay unit 141 corresponds to, for example, the above feedback period.

The conjugate unit 142 acquires the feedback signal from the AD converter 114. The feedback signal is generated by the use of the frequency converter 112, the quadrature detector 113, and the AD converter 114 (feedback system) and is a digital signal including I components and Q components. The conjugate unit 142 calculates a conjugate complex number of the feedback signal and outputs the conjugate complex number to the multiplier 143.

The multiplier 143 multiplies the conjugate complex number acquired from the conjugate unit 142 by a current compensation coefficient acquired from the delay unit 134, and outputs a multiplication result to the multiplier 145.

The subtractor 144 subtracts the feedback signal acquired from the AD converter 114 from the original transmitted signal acquired from the delay unit 141, and outputs a subtraction result to the multiplier 145.

The multiplier 145 multiplies the multiplication result outputted from the multiplier 143 by the subtraction result outputted from the subtractor 144.

The multiplier 146 multiplies a multiplication result outputted from the multiplier 145 by a constant.

The adder 147 adds together the current compensation coefficient acquired from the delay unit 134 and a multiplication result outputted from the multiplier 146, and outputs a calculated value to the memory 133 as a new compensation coefficient. The delay unit 141, the conjugate unit 142, the multipliers 143, 145, and 146, the adder 147, and the subtractor 144 are included in a coefficient calculator for updating a compensation coefficient stored in the memory 133.

In order to model a compensation coefficient operation, the following definitions are given. A transmitted signal before distortion compensation at time t is defined as x(t) where x(t) is a complex number. A power value of the transmitted signal x(t) is defined as $p=|x(t)|^2$. A compensation coefficient before update corresponding to the power value p is defined as $h_{n-1}(p)$ where $h_{n-1}(p)$ is a complex number. An amplification function of the amplifier 106 is defined as f(p) where f(p) is a complex number. A constant is defined as μ. Then the feedback signal is given by $$y(t)=h_{n-1}(p) \cdot x(t) \cdot f(p)$$

where y(t) is a complex number.

The subtraction result outputted from the subtractor 144 is given by $$e(t)=x(t)-y(t)$$

where e(t) is a complex number.

Furthermore, the multiplication result outputted from the multiplier 143 corresponds to the transmitted signal for which distortion compensation is not performed and which has passed through the amplifier 106, and is given by $$u^*(t)=h_{n-1}(p)\cdot y^*(t)=x(t)\cdot f(p)$$

where u(t) is a complex number and the asterisk "*" means a conjugate complex number.

In addition, a compensation coefficient after update is given by $$h_n(p)=h_{n-1}(p)+\mu\cdot e(t)\cdot u^*(t)$$

where $h_n(p)$ is a complex number.

A compensation coefficient is continuously updated by this operation so as to make the difference between the transmitted signal and the feedback signal small. Each compensation coefficient is expected to converge to an optimum value with the elapse of time. The above compensation coefficient operation method is an example and another operation method may be used.

FIG. 6 is an example of a lookup table. An LUT like that indicated in FIG. 6 is stored in the memory 133. An LUT includes a storage area in which a determined number of compensation coefficients can be stored. Each compensation coefficient is identified by an address. For example, the LUT stores 101 compensation coefficients (compensation coefficients #0 through #100) associated with addresses #0 through #100 respectively.

In the second embodiment, as described later, the average (0 dB) of power levels of transmitted signals is associated with the address #50. Power levels lower than the average are associated with the addresses #0 through 49 and power levels higher than the average are associated with the addresses #51 through #100. As a result, 50 compensation coefficients are prepared for transmitted signals the power levels of which are higher than the average and 50 compensation coefficients are prepared for transmitted signals the power levels of which are lower than the average.

As stated above, the address generator 131 uses one of the plurality of index values (power value, an amplitude, and a logarithm of the power value) for generating an address in the LUT. However, an address before correction generated so as to be proportional to each index value will be described first. It is assumed that the average (0 dB) of power values of transmitted signals generated by the transmitted signal generator 101 is $P=A^2=100000$ and that the range of power levels for which distortion compensation is performed is +10 to −40 dB.

Figure 7:
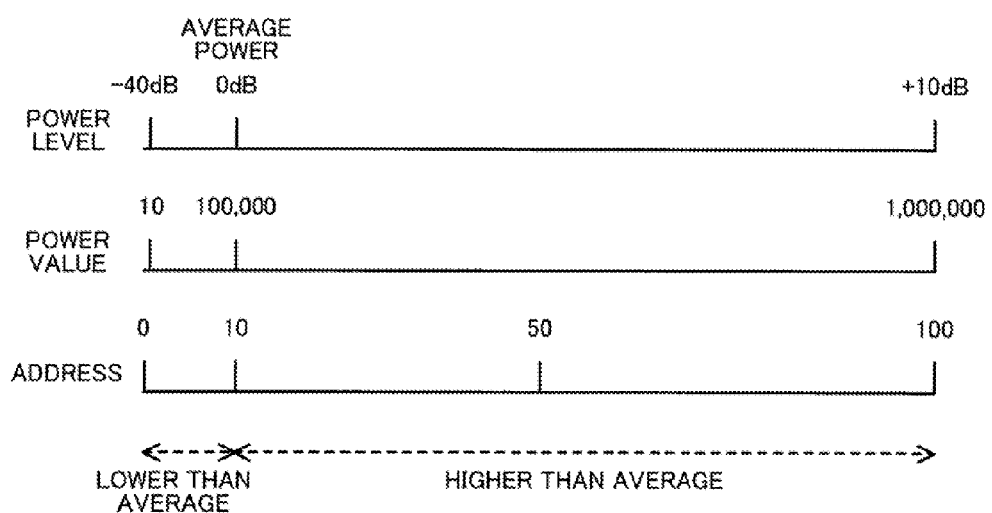
FIG. 7 is an example of the correspondence between a power value and an address before correction.

FIG. 7 is an example of the correspondence between a power value and an address before correction. To generate an address from a power value, the address generator 131 proportionally associates, for example, power values 0 through 1000000 with the addresses #0 through #100 in the LUT. In this case, a power value corresponding to one address is 10000. This is resolution. For example, the address generator 131 divides a power value by 10000, rounds a division result to the nearest whole number, and uses a value obtained as an address.

The address #0 is associated with the power value 10 (−40 dB). The address #1 is associated with the power value 10000 (−10 dB). The address #10 is associated with the power value 100000 (0 dB). The address #100 is associated with the power value 1000000 (+10 dB). If these addresses are not corrected, then the ratio of the number of addresses prepared for transmitted signals the power levels of which are higher than an average to the number of addresses prepared for transmitted signals the power levels of which are lower than the average is 10 to 90. Accordingly, the accuracy of compensation for the transmitted signals the power levels of which are higher than the average is relatively low.

Figure 8:
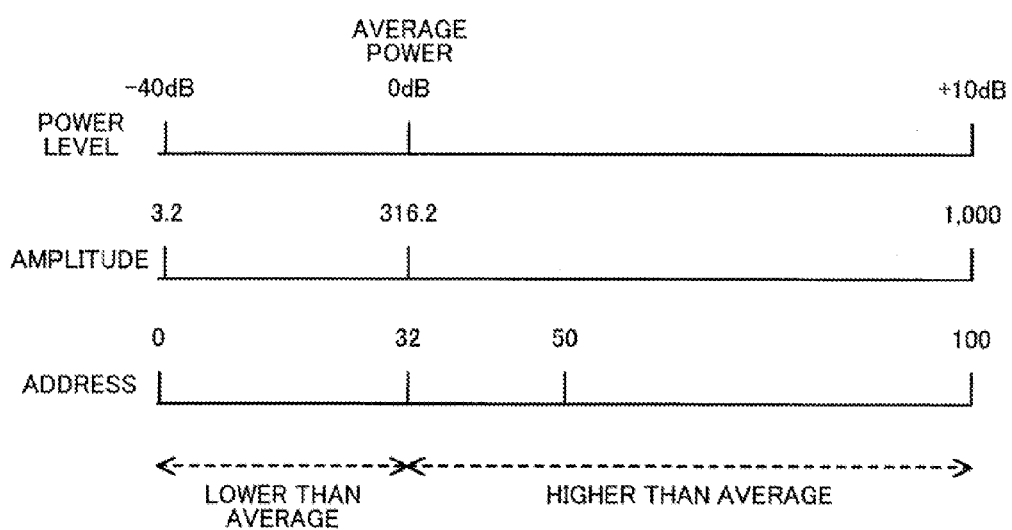
FIG. 8 is an example of the correspondence between an amplitude and an address before correction.

FIG. 8 is an example of the correspondence between an amplitude and an address before correction. To generate an address from an amplitude, the address generator 131 calculates, for example, the square root of a power value as an amplitude and proportionally associates amplitudes 0 through 1000 with the addresses #0 through #100 in the LUT. In this case, an amplitude corresponding to one address is 10. This is resolution. For example, the address generator 131 divides an amplitude by 10, rounds a division result to the nearest whole number, and uses a value obtained as an address.

The address #0 is associated with the amplitude 3.2 (−40 dB). The address #1 is associated with the amplitude 10 (−30 dB). The address #3 is associated with the amplitude 31.6 (−20 dB). The address #10 is associated with the amplitude 100 (−10 dB). The address #32 is associated with the amplitude 316.2 (0 dB). The address #100 is associated with the amplitude 1000 (+10 dB). If these addresses are not corrected, then the ratio of the number of addresses prepared for transmitted signals the power levels of which are higher than an average to the number of addresses prepared for transmitted signals the power levels of which are lower than the average is 32 to 68. Accordingly, the accuracy of compensation for the transmitted signals the power levels of which are higher than the average is relatively low.

Figure 9:
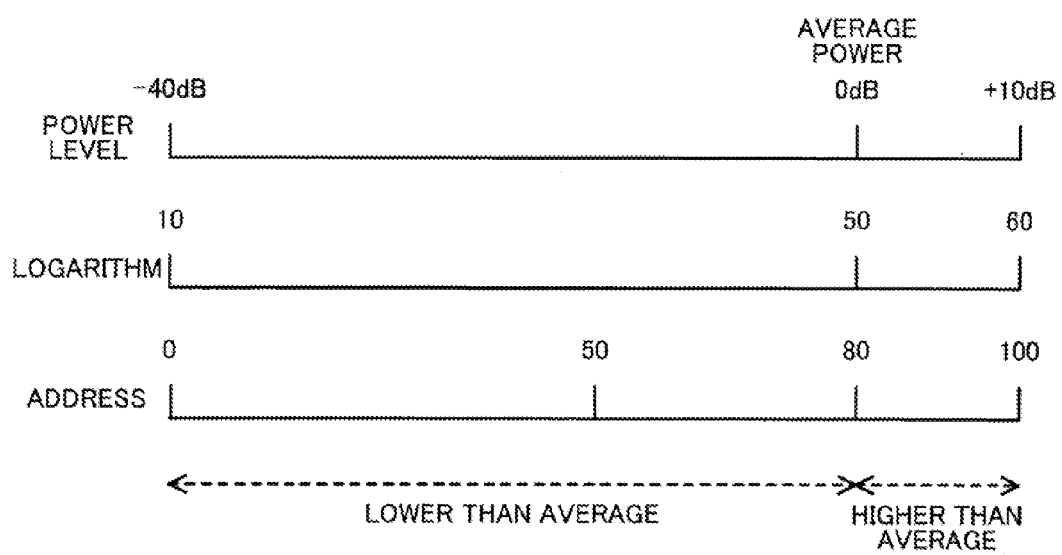
FIG. 9 is an example of the correspondence between a logarithm and an address before correction.

FIG. 9 is an example of the correspondence between a logarithm and an address before correction. To generate an address from a logarithm, the address generator 131 calculates, for example, $10 \log_{10} P$ from a power value P. However, in order to set the lower limit of distortion compensation to −40 dB, the address generator 131 performs clipping (normalization) at logarithmic operation time so as to make the smallest power value 10. For example, the address generator 131 proportionally associates logarithms 10 through 60 with the addresses #0 through #100 in the LUT. In this case, a logarithm corresponding to one address is 20. This is resolution. For example, the address generator 131 uses as an address a value obtained by subtracting 10 from a logarithm and multiplying a subtraction result by 2.

The address #0 is associated with the logarithm 10 (−40 dB). The address #20 is associated with the logarithm 20 (−30 dB). The address #40 is associated with the logarithm 30 (−20 dB). The address #60 is associated with the logarithm 40 (−10 dB). The address #80 is associated with the logarithm 50 (0 dB). The address #100 is associated with the logarithm 60 (+10 dB). If these addresses are not corrected, then the ratio of the number of addresses prepared for transmitted signals the power levels of which are higher than an average to the number of addresses prepared for transmitted signals the power levels of which are lower than the average is 80 to 20. Accordingly, the accuracy of compensation for the transmitted signals the power levels of which are lower than the average is relatively low.

Figure 10:
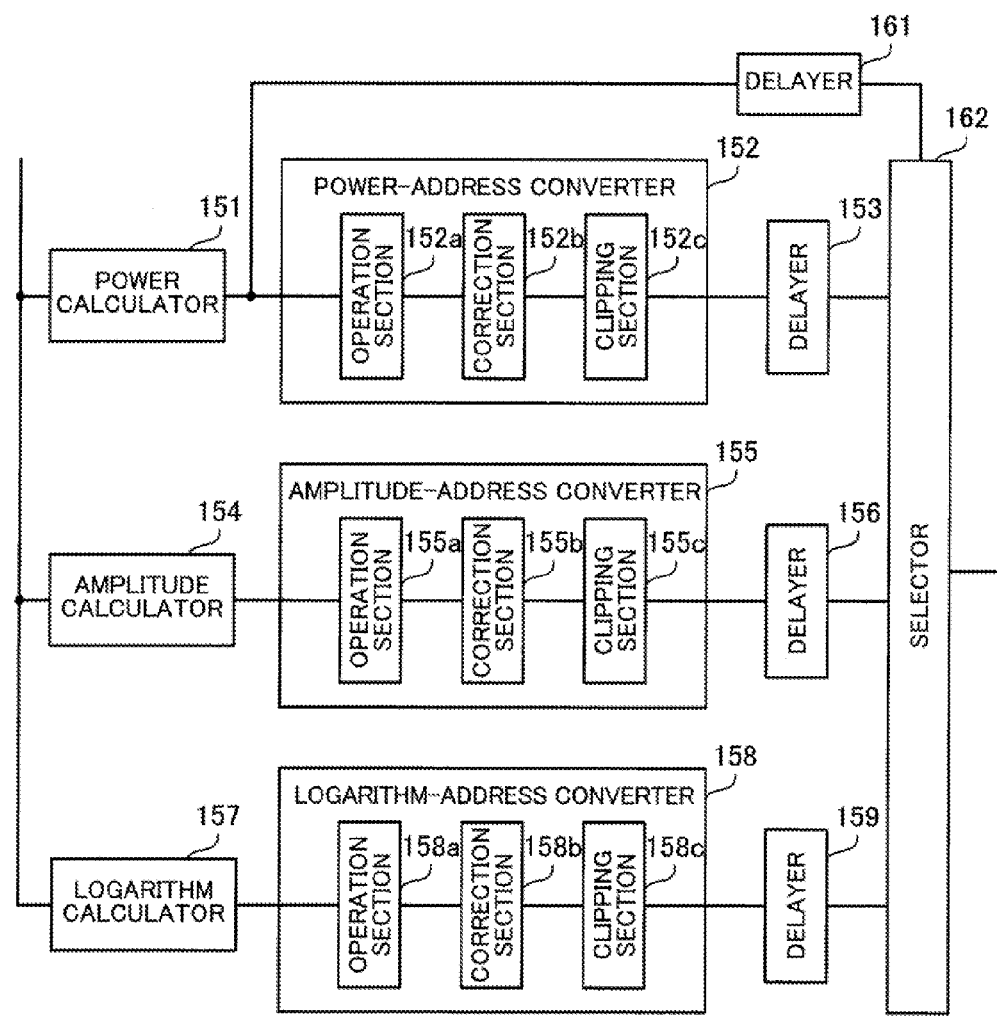
FIG. 10 is a block diagram of an example of an address generator.

FIG. 10 is a block diagram of an example of the address generator. The address generator 131 includes a power calculator 151, a power-address converter 152, an amplitude calculator 154, an amplitude-address converter 155, a logarithm calculator 157, a logarithm-address converter 158, delayers 153, 156, 159, and 161, and a selector 162.

The power calculator 151 calculates a power value P=|x(t)|² of a transmitted signal x(t) acquired from the SP converter 102. The power-address converter 152 converts the power value calculated by the power calculator 151 to one of the addresses #50 through #100. The power-address converter 152 includes an operation section 152a, a correction section 152b, and a clipping section 152c.

As indicated in FIG. 7, the operation section 152a calculates as an address a value obtained by dividing the power value by 10000 and rounding a division result to the nearest whole number. The correction section 152b multiplies the address calculated by the operation section 152a by 50/90, adds 44.5 to a multiplication result, and rounds an addition result to the nearest whole number so that the addresses #10 through #100 before correction will be converted to addresses #50 through #100. The clipping section 152c clips the address corrected by the correction section 152b so that it will fall within the range of 50 (lower limit) to 100 (upper limit).

The amplitude calculator 154 calculates a power value P of a transmitted signal acquired from the SP converter 102, and calculates an amplitude $A=P^{1/2}$. The amplitude-address converter 155 converts the amplitude calculated by the amplitude calculator 154 to one of the addresses #50 through #100. The amplitude-address converter 155 includes an operation section 155a, a correction section 155b, and a clipping section 155c.

As indicated in FIG. 8, the operation section 155a calculates as an address a value obtained by dividing the amplitude by 10 and rounding a division result to the nearest whole number. The correction section 155b multiplies the address calculated by the operation section 155a by 50/68, adds 26.5 to a multiplication result, and rounds an addition result to the nearest whole number so that the addresses #32 through #100 before correction will be converted to addresses #50 through #100. The clipping section 155c clips the address corrected by the correction section 155b so that it will fall within the range of 50 (lower limit) to 100 (upper limit).

The logarithm calculator 157 calculates a power value P of a transmitted signal acquired from the SP converter 102, performs clipping so as to make the lower limit of the power value P 10, and calculates the logarithm $10 \log_{10} P$. The logarithm-address converter 158 converts the logarithm calculated by the logarithm calculator 157 to one of the addresses #0 through #50. The logarithm-address converter 158 includes an operation section 158a, a correction section 158b, and a clipping section 158c.

As indicated in FIG. 9, the operation section 158a calculates as an address a value obtained by subtracting 10 from the logarithm and multiplying a subtraction result by 2. The correction section 158b multiplies the address calculated by the operation section 158a by 50/80 and rounds a multiplication result to the nearest whole number so that the addresses #0 through #80 before correction will be converted to addresses #0 through #50. The clipping section 158c clips the address corrected by the correction section 158b so that it will fall within the range of 0 (lower limit) to 50 (upper limit).

The delayer 153 temporarily holds the address (one of the addresses #50 through #100) generated by the power-address converter 152. The delayer 156 temporarily holds the address (one of the addresses #50 through #100) generated by the amplitude-address converter 155. The delayer 159 temporarily holds the address (one of the addresses #0 through #50) generated by the logarithm-address converter 158. An address generation speed changes according to an index value used, so the delayers 153, 156, and 159 are used for realizing the same address output timing.

The delayer 161 temporarily holds the power value calculated by the power calculator 151.

The selector 162 compares the power value acquired from the delayer 161 with a threshold indicative of an average power value. For example, the power value 100000 indicated in FIG. 7 is used as the threshold. If the power value is greater than the threshold, then the selector 162 selects the address corresponding to the power value acquired from the delayer 153 or the address corresponding to the amplitude acquired from the delayer 156. Which of a power value and an amplitude is adopted is set in advance in the selector 162. If the power value is smaller than or equal to the threshold, then the selector 162 selects the address corresponding to the logarithm acquired from the delayer 159. The selector 162 outputs the selected address to the delay unit 132 and the memory 133.

In the example of FIG. 10, the address generator 131 determines based on a power value whether or not a power level of a transmitted signal is higher than an average. However, the address generator 131 may determine based on another index value or an address whether or not a power level of a transmitted signal is higher than an average.

Figure 11:
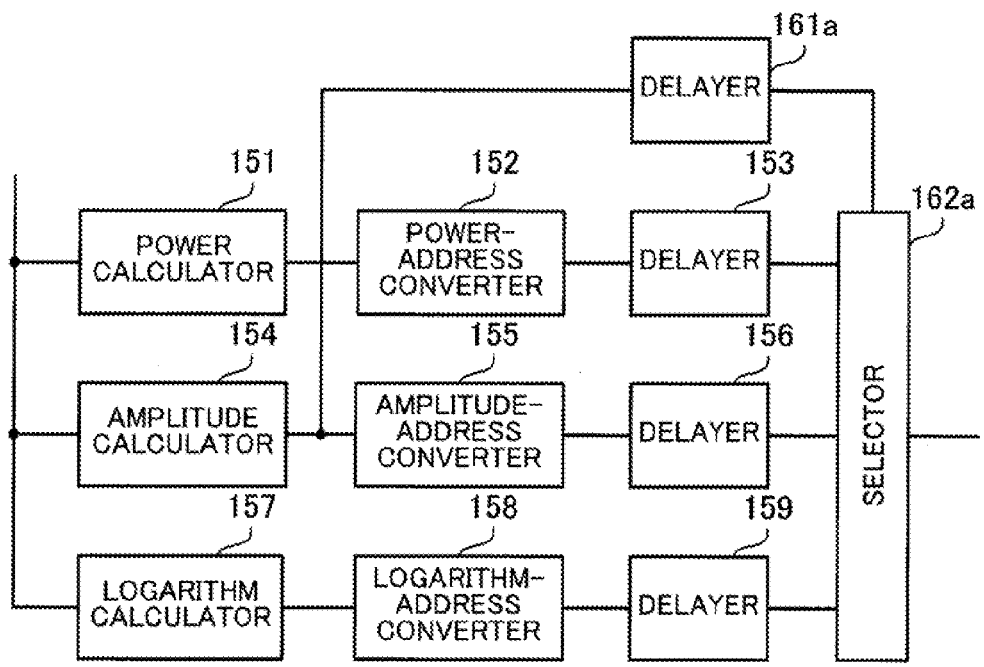
FIG. 11 is a block diagram of a first modification of the address generator.

FIG. 11 is a block diagram of a first modification of the address generator. With the modification of the address generator illustrated in FIG. 11, an address generator 131 includes a delayer 161a and a selector 162a in place of the delayer 161 and the selector 162 illustrated in FIG. 10.

The delayer 161a holds an amplitude calculated by an amplitude calculator 154.

The selector 162a compares the amplitude acquired from the delayer 161a with a threshold indicative of an average amplitude. For example, the amplitude 316.2 indicated in FIG. 8 is used as the threshold. If the amplitude is greater than the threshold, then the selector 162a selects an address acquired from a delayer 153 or a delayer 156. If the amplitude is smaller than or equal to the threshold, then the selector 162a selects an address acquired from a delayer 159.

Figure 12:
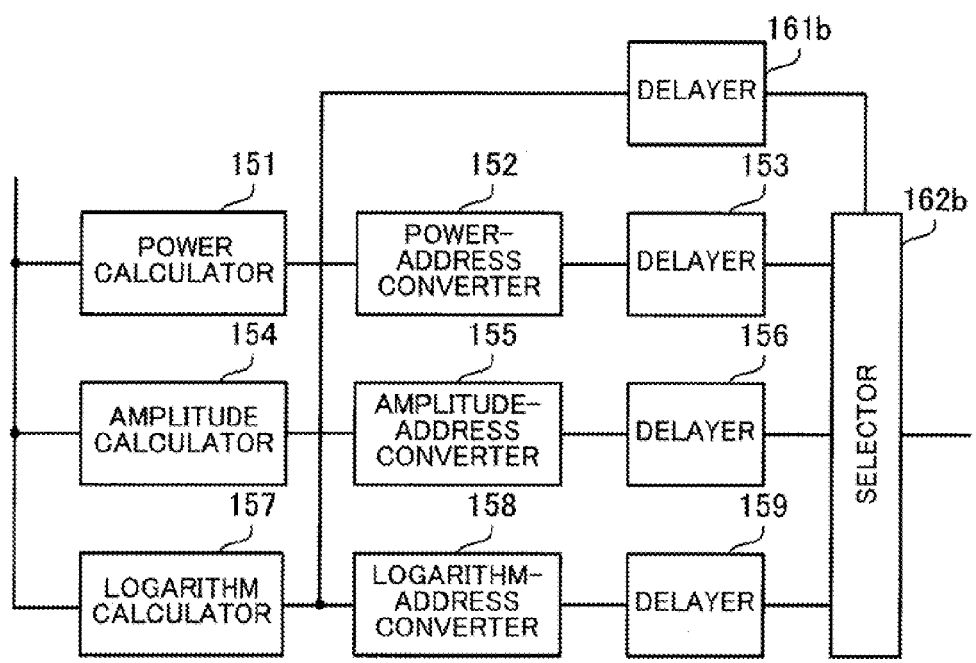
FIG. 12 is a block diagram of a second modification of the address generator.

FIG. 12 is a block diagram of a second modification of the address generator. With the modification of the address generator illustrated in FIG. 12, an address generator 131 includes a delayer 161b and a selector 162b in place of the delayer 161 and the selector 162 illustrated in FIG. 10.

The delayer 161b holds a logarithm calculated by a logarithm calculator 157.

The selector 162b compares the logarithm acquired from the delayer 161b with a threshold indicative of an average logarithm. For example, the logarithm 50 indicated in FIG. 9 is used as the threshold. If the logarithm is greater than the threshold, then the selector 162b selects an address acquired from a delayer 153 or a delayer 156. If the logarithm is smaller than or equal to the threshold, then the selector 162b selects an address acquired from a delayer 159.

The amount of data for an amplitude or a logarithm is smaller than that of data for a power value. Therefore, circuit scale can be reduced by using an amplitude or a logarithm for determining whether or not a power level is higher than an average.

Figure 13:
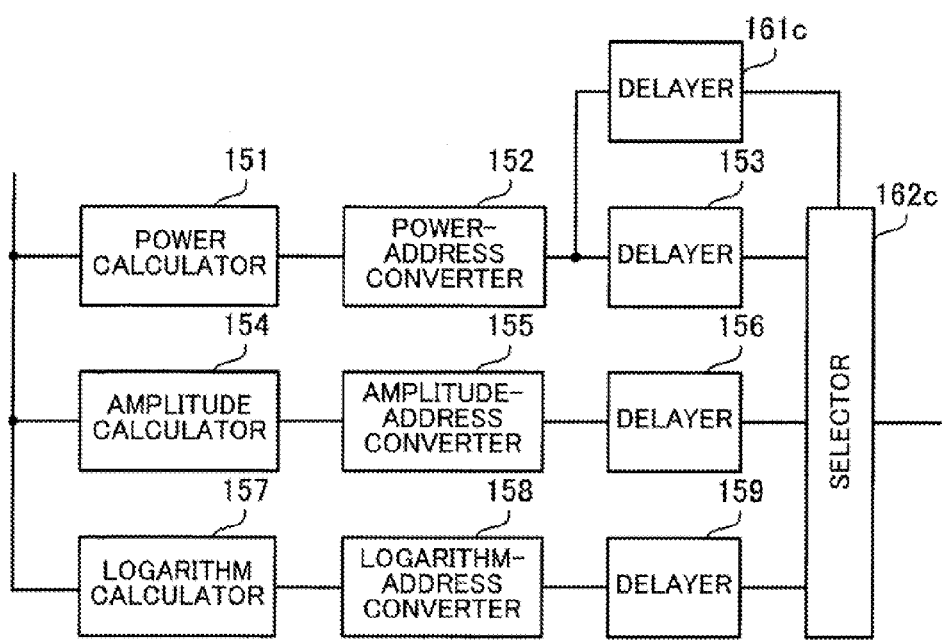
FIG. 13 is a block diagram of a third modification of the address generator.

FIG. 13 is a block diagram of a third modification of the address generator. With the modification of the address generator illustrated in FIG. 13, an address generator 131 includes a delayer 161c and a selector 162c in place of the delayer 161 and the selector 162 illustrated in FIG. 10.

The delayer 161c holds an address generated by a power-address converter 152.

The selector 162c compares the address acquired from the delayer 161c with a threshold (=50). If the address is greater than the threshold (=50), then the selector 162c selects an address acquired from a delayer 153 or a delayer 156. If the address is smaller than or equal to the threshold (if the address is 50), then the selector 162c selects an address acquired from a delayer 159.

Figure 14:
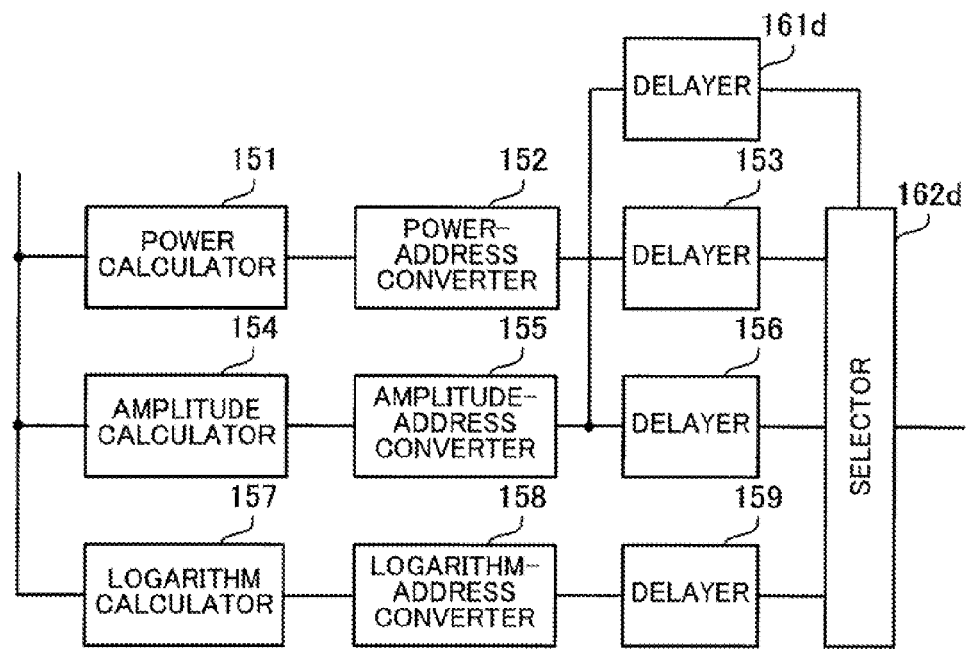
FIG. 14 is a block diagram of a fourth modification of the address generator.

FIG. 14 is a block diagram of a fourth modification of the address generator. With the modification of the address generator illustrated in FIG. 14, an address generator 131 includes a delayer 161d and a selector 162d in place of the delayer 161 and the selector 162 illustrated in FIG. 10.

The delayer 161d holds an address generated by an amplitude-address converter 155.

The selector 162d compares the address acquired from the delayer 161d with a threshold (=50). If the address is greater than the threshold (=50), then the selector 162d selects an address acquired from a delayer 153 or a delayer 156. If the address is smaller than or equal to the threshold (if the address is 50), then the selector 162d selects an address acquired from a delayer 159.

Figure 15:
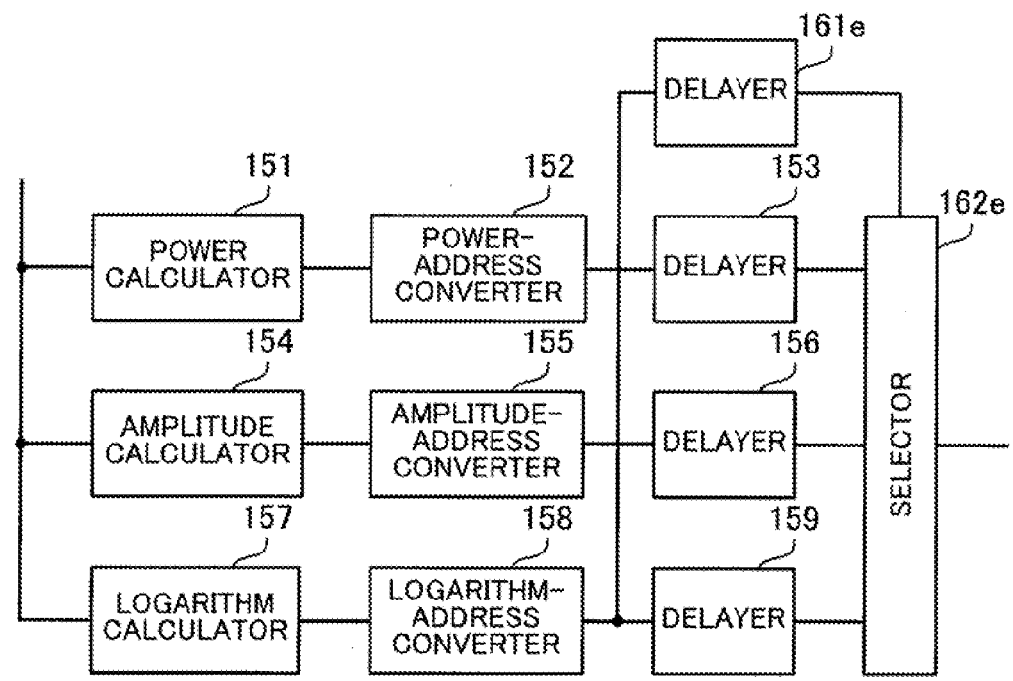
FIG. 15 is a block diagram of a fifth modification of the address generator.

FIG. 15 is a block diagram of a fifth modification of the address generator. With the modification of the address generator illustrated in FIG. 15, an address generator 131 includes a delayer 161e and a selector 162e in place of the delayer 161 and the selector 162 illustrated in FIG. 10.

The delayer 161e holds an address generated by a logarithm-address converter 158.

The selector 162e compares the address acquired from the delayer 161e with a threshold (=49). If the address is greater than the threshold (if the address is 50), then the selector 162e selects an address acquired from a delayer 153 or a delayer 156. If the address is smaller than or equal to the threshold (=49), then the selector 162e selects an address acquired from a delayer 159.

Figure 16:
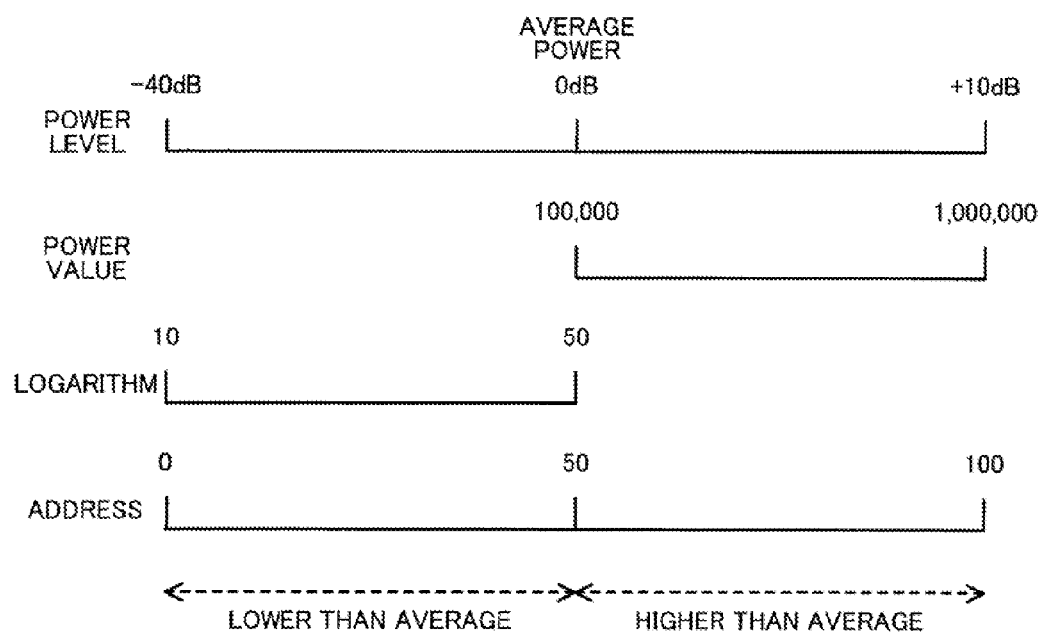
FIG. 16 is an example of the correspondence between a power value and a logarithm and an address after correction.

FIG. 16 is an example of the correspondence between a power value and a logarithm and an address after correction. In the example of FIG. 16, it is assumed that the address generator 131 is set so that when a power level of a transmitted signal is higher than an average, a power value will be selected as an index value.

Power values 100000 through 1000000 (0 through +10 dB) are associated with addresses #50 through #100 in an LUT by the above address generation method. Furthermore, logarithms 10 through 50 (−40 through 0 dB) are associated with addresses #0 through #50 in the LUT.

Figure 17:
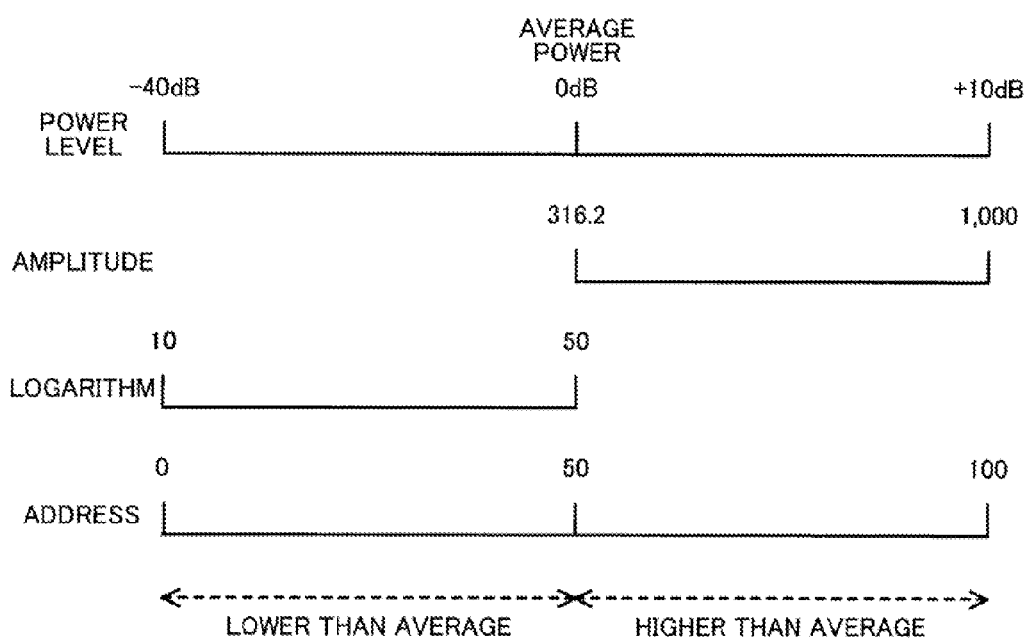
FIG. 17 is an example of the correspondence between an amplitude and a logarithm and an address after correction.

When a power level is higher than the average, the address generator 131 selects an address calculated from a power value. In addition, when a power level is lower than the average, the address generator 131 selects an address calculated from a logarithm. When a power level is approximately equal to the average, an address calculated from a power value is the same as an address calculated from a logarithm. The address generator 131 may select any of them. FIG. 17 is an example of the correspondence between an amplitude and a logarithm and an address after correction. In the example of FIG. 17, it is assumed that the address generator 131 is set so that when a power level of a transmitted signal is higher than an average, an amplitude will be selected as an index value.

Amplitudes 316.2 through 1000 (0 through +10 dB) are associated with addresses #50 through #100 in an LUT by the above address generation method. Furthermore, logarithms 10 through 50 (−40 through 0 dB) are associated with addresses #0 through #50 in the LUT.

When a power level is higher than the average, the address generator 131 selects an address calculated from an amplitude. In addition, when a power level is lower than the average, the address generator 131 selects an address calculated from a logarithm. When a power level is approximately equal to the average, an address calculated from an amplitude is the same as an address calculated from a logarithm. The address generator 131 may select any of them.

Figure 18:
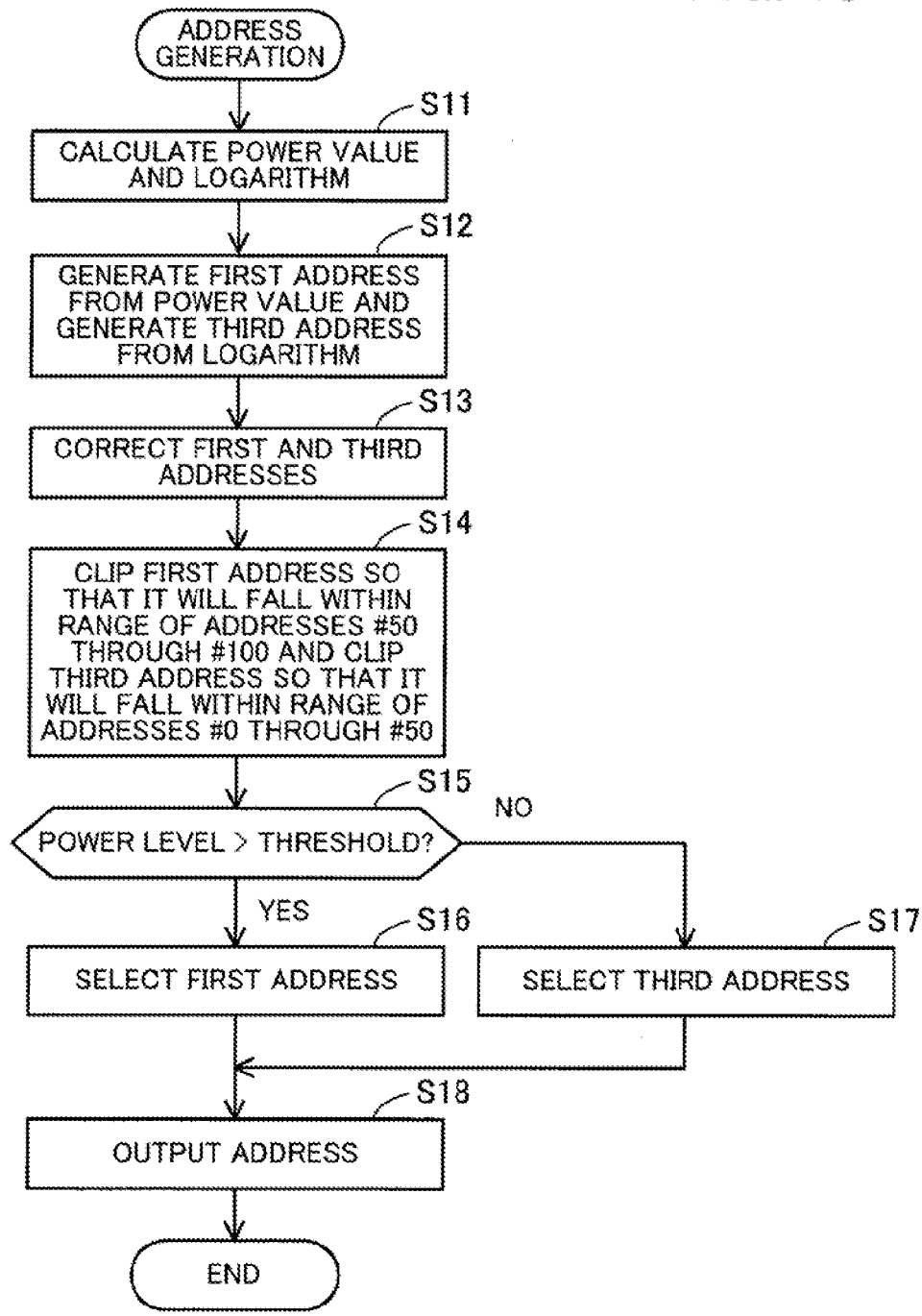
FIG. 18 is a first flow chart of an address generation method.

FIG. 18 is a first flow chart of an address generation method. With the flow chart indicated in FIG. 18, it is assumed that the address generator 131 is set so that when a power level of a transmitted signal is higher than an average, an amplitude will be selected as an index value.

(Step S11) The power calculator 151 calculates a power value of a transmitted signal. The logarithm calculator 157 calculates a power value P of the transmitted signal and calculates the logarithm $10 \log_{10} P$ from the power value P. The power calculator 151 and the logarithm calculator 157 can operate in parallel. At this time the amplitude calculator 154 may calculate an amplitude or stop its operation.

(Step S12) The operation section 152a generates a first address from the power value. For example, the operation section 152a divides the power value by 10000 and rounds a division result to the nearest whole number. The operation section 158a generates a third address from the logarithm. For example, the operation section 158a subtracts 10 from the logarithm and multiplies a subtraction result by 2. The operation section 152a and the operation section 158a can operate in parallel. At this time the operation section 155a may generate a second address or stop its operation.

(Step S13) The correction section 152b corrects the first address. For example, the correction section 152b multiplies the first address by 50/90, adds 44.5 to a multiplication result, and rounds an addition result to the nearest whole number. The correction section 158b corrects the third address. For example, the correction section 158b multiplies the third address by 50/80 and rounds a multiplication result to the nearest whole number. The correction section 152b and the correction section 158b can operate in parallel. At this time the correction section 155b may correct the second address or stop its operation.

(Step S14) The clipping section 152c clips the first address after the correction so that it will fall within the range of addresses #50 through #100. The clipping section 158c clips the third address after the correction so that it will fall within the range of addresses #0 through #50. The clipping section 152c and the clipping section 158c can operate in parallel. At this time the clipping section 155c may clip the second address or stop its operation.

(Step S15) By comparing the power value acquired from the delayer 161 with a threshold, the selector 162 determines whether or not a power level is higher than an average. However, the selector 162 may use the amplitude, the logarithm, the first address, the second address, or the third address in place of the power value. In this case, a threshold changes according to an index value or an address used for determining a power level. If the power level is higher than the average, then the selector 162 proceeds to step S16. If the power level is not higher than the average, then the selector 162 proceeds to step S17.

(Step S16) The selector 162 selects the first address generated from the power value. The selector 162 then proceeds to step S18.

(Step S17) The selector 162 selects the third address generated from the logarithm.

(Step S18) The selector 162 outputs the address selected in step S16 or S17 as a read address to the memory 133 which stores an LUT, and outputs it to the delay unit 132 as a write address.

Figure 19:
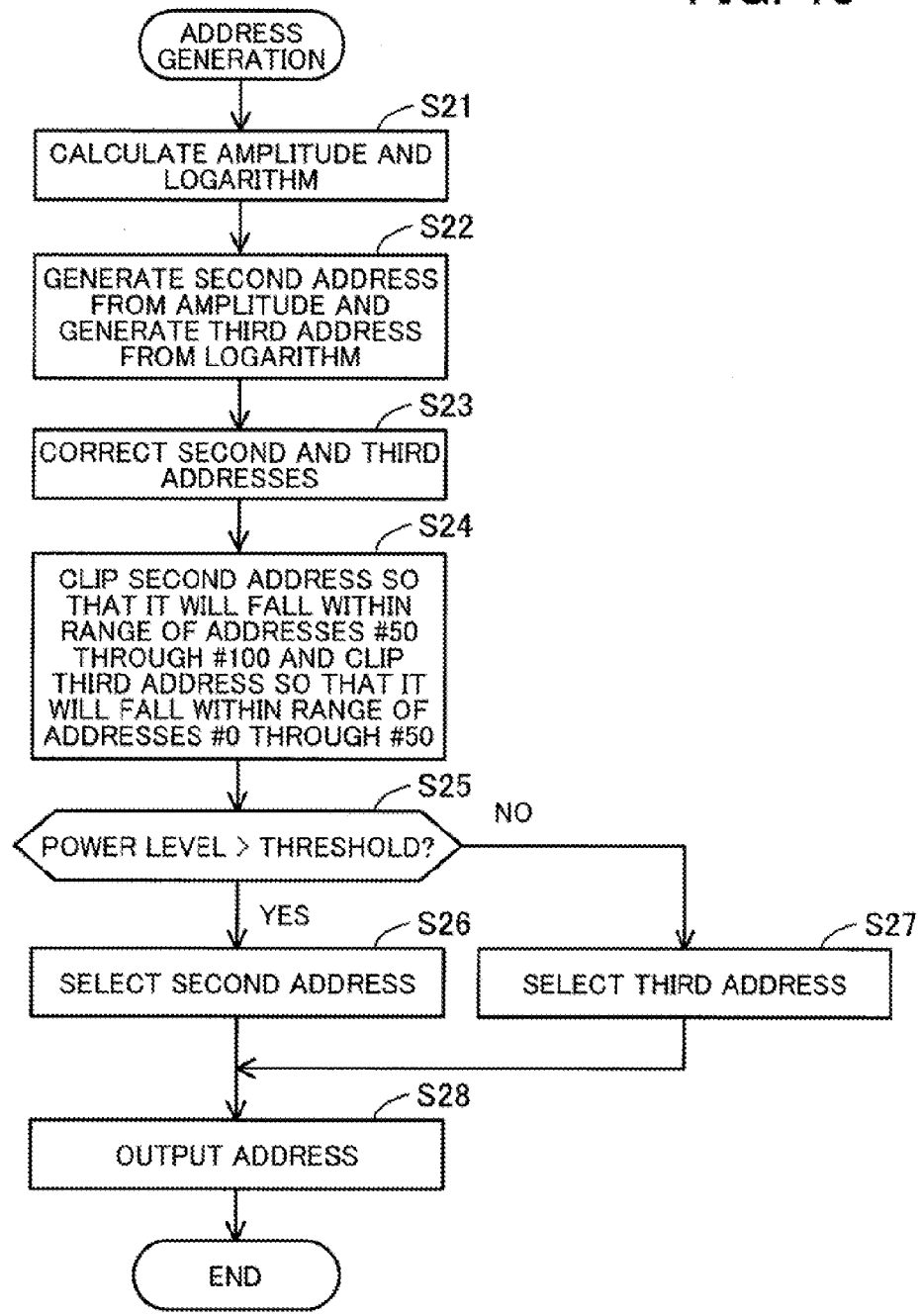
FIG. 19 is a second flow chart of an address generation method.

FIG. 19 is a second flow chart of an address generation method. With the flow chart indicated in FIG. 19, it is assumed that the address generator 131 is set so that when a power level of a transmitted signal is higher than an average, an amplitude will be selected as an index value.

(Step S21) The amplitude calculator 154 calculates a power value of a transmitted signal and calculates an amplitude from the power value. The logarithm calculator 157 calculates a power value of the transmitted signal and calculates a logarithm from the power value. The amplitude calculator 154 and the logarithm calculator 157 can operate in parallel. At this time the power calculator 151 may calculate a power value or stop its operation.

(Step S22) The operation section 155*a* generates a second address from the amplitude. For example, the operation section 155*a* divides the amplitude by 10 and rounds a division result to the nearest whole number. The operation section 158*a* generates a third address from the logarithm. For example, the operation section 158*a* subtracts 10 from the logarithm and multiplies a subtraction result by 2. The operation section 155*a* and the operation section 158*a* can operate in parallel. At this time the operation section 152*a* may generate a first address or stop its operation.

(Step S23) The correction section 155*b* corrects the second address. For example, the correction section 155*b* multiplies the second address by 50/68, adds 26.5 to a multiplication result, and rounds an addition result to the nearest whole number. The correction section 158*b* corrects the third address. For example, the correction section 158*b* multiplies the third address by 50/80 and rounds a multiplication result to the nearest whole number. The correction section 155*b* and the correction section 158*b* can operate in parallel. At this time the correction section 152*b* may correct the first address or stop its operation.

(Step S24) The clipping section 155*c* clips the second address after the correction so that it will fall within the range of addresses #50 through #100. The clipping section 158*c* clips the third address after the correction so that it will fall within the range of addresses #0 through #50. The clipping section 155*c* and the clipping section 158*c* can operate in parallel. At this time the clipping section 152*c* may clip the first address or stop its operation.

(Step S25) By comparing the power value acquired from the delayer 161 with a threshold, the selector 162 determines whether or not a power level is higher than an average. However, the selector 162 may use the amplitude, the logarithm, the first address, the second address, or the third address in place of the power value. If the power level is higher than the average, then the selector 162 proceeds to step S26. If the power level is not higher than the average, then the selector 162 proceeds to step S27.

(Step S26) The selector 162 selects the second address generated from the amplitude. The selector 162 then proceeds to step S28.

(Step S27) The selector 162 selects the third address generated from the logarithm.

(Step S28) The selector 162 outputs the address selected in step S26 or S27 as a read address to the memory 133 which stores an LUT, and outputs it to the delay unit 132 as a write address.

With the radio communication system according to the second embodiment which of an address generated from a power value or an amplitude and an address generated from a logarithm is used depends on whether a power level of a transmitted signal is higher than an average or not when a compensation coefficient is read and written. As a result, the imbalance in the number of selectable compensation coefficients between cases where a power level is higher than an average and cases where a power level is lower than the average can be reduced (for example, the number of compensation coefficients which can be selected in the case of a power level being higher than the average can be made equal to that of compensation coefficients which can be selected in the case of a power level being lower than the average), and a change in compensation accuracy can be controlled.

Furthermore, by extracting and adopting an address interval in which compensation accuracy is high for each of a power value, an amplitude, and a logarithm, a change in compensation accuracy in each of an address interval corresponding to a power level higher than an average and an address interval corresponding to a power level lower than the average can be controlled. In the second embodiment one of two index values is used with the average (0 dB) of power levels as a boundary. However, a power level other than the average may be considered as a boundary. In addition, in the second embodiment the median (address #50) of addresses in an LUT is considered as a boundary for division. However, an address other than the median may be considered as a boundary.

The accuracy of distortion compensation is improved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A distortion compensator for compensating for distortion of a signal caused by an amplifier, the distortion compensator comprising:
   a storage section which stores a plurality of compensation coefficients used for distortion compensation, the plurality of compensation coefficients being identified by addresses; and
   a selection section which accesses, when a power level of the signal is in a first range of power levels, one of the plurality of compensation coefficients by using a first address converted from a first index value, and accesses, when the power level is in a second range of the power levels, one of the plurality of compensation coefficients by using a second address converted from a second index value,
   the first index value indicating the power level and being calculated without using a logarithmic operation, the second index value indicating the power level and being calculated by using the logarithmic operation.

2. The distortion compensator according to claim 1, wherein the first range of the power levels is higher than the second range of the power level.

3. The distortion compensator according to claim 1, wherein:
   a range of first index values calculated without using the logarithmic operation is associated with a first address range of the storage section; and
   a range of second index values calculated by using the logarithmic operation is associated with a second address range of the storage section.

4. The distortion compensator according to claim 1, wherein when the selection section determines whether or not the power level is in the first range, the selection section compares one of a plurality of index values including the first index value and the second index value with a threshold.

5. The distortion compensator according to claim 1, wherein when the selection section determines whether or not the power level is in the first range, the selection section compares the first address or the second address with a threshold.

6. The distortion compensator according to claim 1, wherein:
   the first index value is a power value or an amplitude of the signal; and
   the second index value is a value calculated by performing the logarithmic operation on the power value of the signal.

7. A distortion compensation method performed by a distortion compensator for compensating for distortion of a signal caused by an amplifier, the method comprising:
   determining whether a power level of the signal is in a first range of power levels or a second range of the power levels;
   accessing, when the power level is in the first range, one of a plurality of compensation coefficients by using a first address converted from a first index value, the plurality of compensation coefficients being used for distortion compensation and being identified by addresses, the first index value indicating the power level and being calculated without using a logarithmic operation; and
   accessing, when the power level is in the second range, one of the plurality of compensation coefficients by using a second address converted from a second index value, the second index value indicating the power level and being calculated by using the logarithmic operation.

* * * * *